(12) United States Patent
Merrill (10) Patent No.: US 6,965,102 B1
(45) Date of Patent: Nov. 15, 2005

(54) LARGE DYNAMIC RANGE, LOW-LEAKAGE VERTICAL COLOR PIXEL SENSOR

(75) Inventor: Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 673 days.

(21) Appl. No.: 10/116,925

(22) Filed: Apr. 5, 2002

(51) Int. Cl.[7] .............................................. H01L 27/00

(52) U.S. Cl. .............................. 250/208.1; 250/214.1; 257/291; 348/308

(58) Field of Search ........................ 250/208.1, 214.1, 250/226; 348/294, 296, 297, 301, 302, 308; 257/290, 291, 292, 443

(56) References Cited

U.S. PATENT DOCUMENTS

| | | | | |
|---|---|---|---|---|
| 4,677,453 A | * | 6/1987 | Matsumoto et al. ........ | 257/291 |
| 5,614,744 A | * | 3/1997 | Merrill ....................... | 257/291 |
| 5,705,846 A | * | 1/1998 | Merrill ....................... | 257/462 |
| 5,789,774 A | * | 8/1998 | Merrill ....................... | 257/292 |
| 5,892,541 A | | 4/1999 | Merrill ....................... | 348/302 |
| 5,965,875 A | * | 10/1999 | Merrill ....................... | 250/226 |
| 6,011,251 A | | 1/2000 | Dierickx et al. ........... | 250/208.1 |
| 6,160,282 A | * | 12/2000 | Merrill ....................... | 257/292 |
| 6,175,383 B1 | | 1/2001 | Yadid-Pecht et al. ....... | 348/302 |
| 6,204,524 B1 | | 3/2001 | Rhodes ....................... | 257/222 |
| 6,586,789 B1 | * | 7/2003 | Zhao .......................... | 257/292 |
| 6,590,242 B1 | * | 7/2003 | Kozuka et al. ............. | 257/292 |
| 6,639,261 B2 | * | 10/2003 | Rhodes ....................... | 257/291 |

OTHER PUBLICATIONS

Richard B. Merrill, "Vertical Color Filter Derector Group And Array", 36 pp. Specification. 19 pp. Claims, 2 pp. Abstract, 12 Drawing Sheets, U.S. Appl. No. 09/884,863, filed Jun. 18, 2001.

* cited by examiner

*Primary Examiner*—Kevin Pyo
(74) *Attorney, Agent, or Firm*—Sierra Patent Group, Ltd.

(57) ABSTRACT

A low-leakage, high-dynamic range active pixel sensor is formed on a p-type semiconductor substrate. A photodiode cathode n-type region is disposed within the semiconductor substrate forming a pn junction with the semiconductor substrate. An n-well is disposed in the semiconductor substrate and in electrical contact with the photodiode cathode n-type region. An annular p-well in the semiconductor substrate is disposed around and spaced apart from the n-well. An annular polysilicon gate region forming a gate for a reset transistor is disposed over a thick gate dielectric on the surface of the semiconductor substrate. An annular n-type region is disposed within and inward from an inner periphery of the annular p-well and has inner edges substantially aligned with an outer periphery of the annular polysilicon gate region. The annular n-type region forms a drain for the reset transistor. A surface n-type region is disposed in the n-well at the surface of the semiconductor substrate. The surface n-type region has outer edges substantially aligned with an inner periphery of the annular polysilicon gate region and forms a drain for the reset transistor. A thick gate dielectric sense transistor has a gate coupled to the surface n-type region, a drain coupled to a drain supply potential, and a source. An output transistor has a drain coupled to the source of the sense transistor, a gate coupled to a row-select line, and a source coupled to a column output line. Sources, drains, and gates of the transistors may be silicided.

19 Claims, 3 Drawing Sheets

LARGE DYNAMIC RANGE, LOW-LEAKAGE VERTICAL COLOR PIXEL SENSOR

BACKGROUND OF THE INVENTION

1. Field of the Invention

The present invention relates to active pixel sensors. More particularly, the present invention relates to active pixel sensors having improved dynamic range and low leakage.

2. The Prior Art

Active pixel image sensors are known in the art. Multicolor active pixel image sensors are also known, as exemplified by the three-color active pixel sensor disclosed in U.S. Pat. No. 5,965,875 to Merrill.

Dynamic range is a very high profile specification for image sensors, because it affects exposure latitude and the ability to capture a range of light levels close to the range exhibited by human perception. The standard definition of dynamic range is the maximum signal range (signal output at saturation) of a sensor divided by the noise standard deviation of the sensor in darkness. One way to increase the dynamic range of an active pixel sensor is to increase capacitance of the pixel. Increased capacitance at detection and sensing nodes of a pixel results in a greater total signal charge capture capability, thereby increasing the maximum signal range of the pixel. However, the increased dynamic range of the pixel comes at the expense of reduced sensitivity as well as reduced signal-to-noise ratio at low-light-level signals. The sensitivity of the pixel is reduced because more photons are required to give an equivalent variation in voltage at the pixel, and noise increases because the larger pixel area is susceptible to more leakage current which is both an area and perimeter dependent phenomenon, and because a higher capacitance causes a greater charge domain component of KTC noise, sometimes referred to as reset noise.

An additional way to increase the dynamic range is to reduce the noise level. The primary difficulty with this approach is that many of the noise mechanisms are based on fundamental physical principles and behaviors that cannot be easily altered. Once the sensor designer hits the limits of noise reduction in terms of physics, this approach is no longer useful for dynamic range enhancement.

A third way of increasing the dynamic range is to increase the signal range without changing the pixel capacitance. This can be done by increasing the operating voltage of the pixel and therefore directly increasing the total amount of charge that can be collected. Increasing the voltage can introduce some problems, namely increased noise due to leakage current and potential device breakdown or damage due to high electric fields present across thin gate oxide layers.

There are numerous examples of prior-art approaches to increase dynamic range in pixel sensors. U.S. Pat. No. 6,175,383 teaches a pixel design and operation method that permits increased dynamic range. Dynamic range increase is obtained by controlling the reset signal to each pixel individually. This permits different pixels to integrate light for different lengths of time. Pixels that are subject to lower illumination levels can integrate for a long time, building up a substantial signal, and pixels that are exposed to high levels of illumination can integrate for a much shorter period, preventing saturation.

U.S. Pat. No. 5,892,541 teaches a pixel design and operation method for an active pixel sensor that permits the value of each pixel to be read mutliple times during exposure, thereby allowing the progress during integration to be monitored. Pixels that approach saturation prematurely can be reset, and their outputs stored over time. At the end of the total integration period, all of the stored values can be assembled to form an image that is of higher dynamic range than that which is possible without this method.

U.S. Pat. No. 6,011,251 teaches a pixel design and method that permits multiple samplings of the output of the pixel during the integration period. This multi-sampling approach permits the response characteristic of the pixel to be a multiple slope characteristic, with higher sensitivity in dark areas and lower sensitivity in bright areas.

In all three of the above identified patents, greater dynamic range is achieved at the expense of circuit complexity and a certain amount of post-processing of the image data to reconstruct the image.

U.S. Pat. No. 5,614,744 teaches a pixel design that eliminates the active area edge from the photo sensitive node of the pixel, thereby reducing leakage current and therefore permitting larger dynamic range. This method does not completely address the voltage swing that can be achieved with the pixel because the maximum voltage swing is still limited by the magnitude of the electric field that can be tolerated by the gate oxide of the transistors in the pixel. Because the voltage swing is limited to a small range the dynamic range improvement achieved with this invention is smaller than optimal.

U.S. Pat. No. 6,204,524 teaches adding a capacitor in parallel with the photo sensitive node to increase signal to noise ratio and increase the amount of photo-generated charge that can be collected by the pixel. This patent effectively teaches a method of reducing the voltage swing per unit photo-generated charge, which increases the dynamic range, but also decreases the sensitivity.

U.S. Pat. No. 6,160,282, teaches a pixel design that eliminates the presence of silicides in the sensitive nodes, thereby reducing leakage current. Noise reduction and increased dynamic range are achieved by reducing leakage current, but the limitation on voltage range is still present in this invention.

BRIEF DESCRIPTION OF THE INVENTION

The present invention is an active pixel sensor that permits the use of silicides in pixel-sensor structures while still maintaining low leakage current. A low-leakage, high-dynamic range active pixel sensor is formed on a p-type semiconductor substrate. A photodiode cathode n-type region is disposed within the semiconductor substrate forming a pn junction with the semiconductor substrate. An n-well is disposed in the semiconductor substrate and in electrical contact with the photodiode cathode n-type region. In a vertical color filter embodiment of the present invention, the photodiode n-type regions for the red and green photodiodes will be formed by epitaxial layers and will be isolated by p-type epitaxial layers. Contact to the read and green photodiodes will be made by means of multi-layer contacts. An annular p-well in the semiconductor substrate is disposed around and spaced apart from the n-well. An annular polysilicon gate region forming a gate for a reset transistor is disposed over a thick gate dielectric on the surface of the semiconductor substrate. An annular n-type region is disposed within and inward from an inner periphery of the annular p-well and has inner edges substantially aligned with an outer periphery of the annular polysilicon gate region. The annular n-type region forms a drain for the reset transistor. A surface n-type region is disposed in the n-well at the surface of the semiconductor substrate. The surface n-type region has outer edges substantially aligned with an inner periphery of the annular polysilicon gate region and forms a drain for the reset transistor. A thick gate dielectric sense transistor has a gate coupled to the surface n-type region, a drain coupled to a drain supply potential, and a source. An output transistor has a drain coupled to the source of the sense transistor, a gate coupled to a row-select line, and a source coupled to a column output line.

The present invention speaks directly to the problem of achieving high signal range while maintaining low noise, and therefore directly goes to improving dynamic range in image sensors.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons having the benefit of this disclosure.

Increasing the dynamic range of a pixel by increasing the voltage swing does not compromise sensitivity. Pixel voltage swing in an advanced CMOS process is limited by two factors: 1) leakage in the gate dielectric and 2) junction leakage controlled by the electric field, primarily around the perimeter of the junctions. If gate current can be reduced to a negligible level by use of optional thick gate dielectric transistors, then the only problem to be solved is reducing the junction electric field. The photodiode node is the only node that must have low leakage.

In deep sub-micron CMOS processes two gate dielectric thicknesses are commonly employed, one for smaller low-voltage digital devices and one for larger high-voltage devices which are sometimes employed for implementing analog functions. The term "thick gate dielectric" as used herein will be understood by persons of ordinary skill in the art to refer to the thicker of the two gate dielectric thicknesses and would typically have a thickness of about 70 angstroms in a 0.18 micron 35 angstrom CMOS process.

Figure 1:
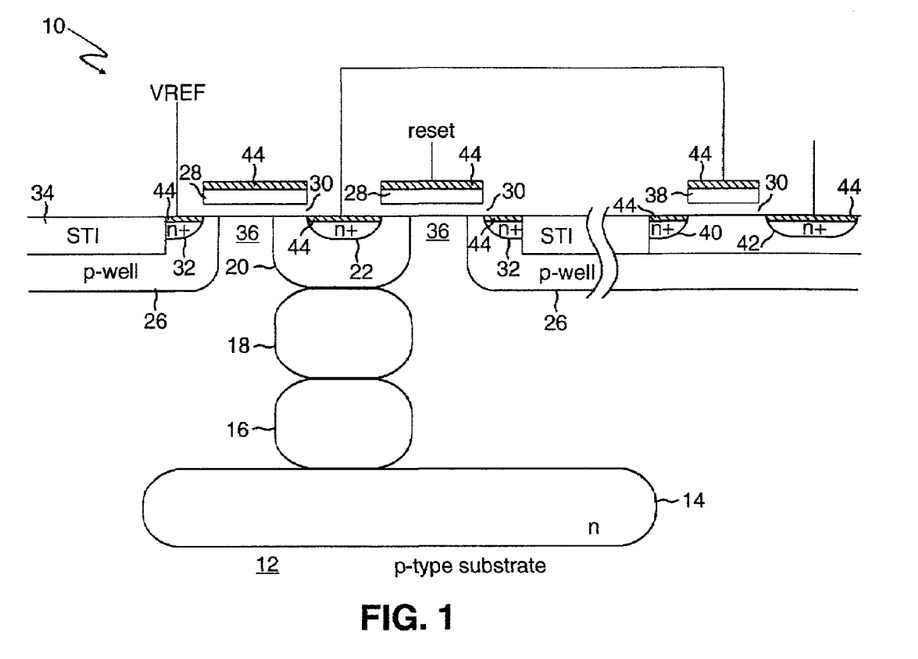
FIG. 1 is a cross-sectional view through a portion of an illustrative vertical three-color active pixel sensor.
Figure 2:
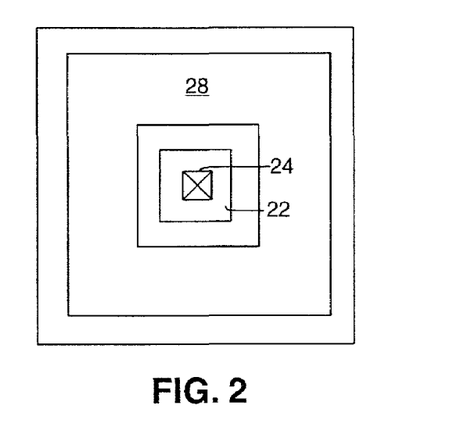
FIG. 2 is a top view of a layout for the vertical three-color active pixel sensor, a portion of which is shown in FIG. 1.

Referring first to FIGS. 1 and 2, a cross section and a top view, respectively, of a portion of a three-color active pixel sensor according to an illustrative embodiment of the present invention. N-wells may be used in vertical multi-color active pixel sensors to connect to the buried layers that collect photocurrent at different depths. According to the present invention, these same n-wells can also be used to create transistors as shown in FIG. 1. In the case of the design of FIG. 1, the relatively light doping of the N-well allows for a very low electric field across the junction associated with the reset transistor.

A vertical three-color active pixel sensor as may be used in the present invention includes three photodiodes, one each for the red, green, and blue detection. Persons of ordinary skill in the art will understand from this disclosure that the description and discussion applies to all three of the color channels. In addition, while FIG. 1 shows a buried blue detector layer, person of ordinary skill in the art will recognize that the three-color active pixel sensor can also employ a surface layer photodiode for the blue detector layer. It is also evident that the active pixel sensor of the present invention need not be limited to the three-color sensor which is shown in the illustrative embodiment of FIGS. 1 and 2, and that sensors of more or less than three colors are possible.

In active pixel sensor 10 of FIG. 1, the p-type substrate 12r acts as the anode of the red photodiode and n-type region 14r acts as its cathode. As may be seen from FIG. 1, the photodiode cathode n-type region 14r lies below the surface of the semiconductor structure and can be referred to herein as a "buried detector layer" to differentiate it from a photodiode cathode that may be formed at the surface of the semiconductor structure. A multi-layer n-type contact plug is formed from n-type implants 16r and 18r and n-well 20r, and includes an n-type contact region 22r at the surface of n-well 20r for making electrical contact with the buried detector layer 14r via contact 24r. Such a structure is disclosed in co-pending application Ser. No. 09/884,863, filed Jun. 18, 2001, assigned to the same assignee as the present invention. This co-pending application is expressly incorporated by reference herein.

As may be seen most easily with reference to FIGS. 1 and 2 together, an annular p-well region 26-1 is disposed around and spaced apart from n-type region 20r. An annular polysilicon gate 28r is disposed over a thick gate dielectric 30r. An annular n-type region 32r is formed in the annular p-well region 26-1. As persons of ordinary skill in the art will appreciate from an examination of FIG. 1, annular n-type region 32r and n-type region 22r may be formed using self-aligned gate techniques with annular polysilicon gate 28r as a mask. Shallow-trench isolation region 34r may be used for isolation of n-type region 32r. An annular transistor formed from n-type region 22r, annular n-type region 32r, and annular gate 28r over thick gate oxide 30r functions as a reset transistor for the red photodiode and has an annular channel region 36 disposed under gate 28r and between its source n-type region 22r and its drain n-type region 32r. The reference voltage Vref is applied to the drain 32r of the reset transistor and its source 22r is coupled to the cathode 14r of the red photodiode through the multi-layer contact 16r, 18r, and n-well 20r.

A sense transistor, shown in the right-hand portion of p-well 26-1 of FIG. 1 has a gate 38r coupled to the n-type region 22r and thus to the cathode 14r of the red photodiode. The sense transistor 38r also employs a thick gate dielectric 30r. N+ region 40r forms the drain of the sense transistor and n+ region 42r forms its source as well as the drain of a row-select transistor (not shown). Persons of ordinary skill in the art will appreciate that the NMOS transistors other than the reset transistor associated with the active pixel sensor of FIGS. 1 and 2 may all be formed in p-well 26-1.

A green photodiode is provided in a following manner a first epitaxial region 12g is deposited above the n-type cathode layer 14r. The p-type first epitaxial region 12g acts as the anode of the photodiode. N-type region 14g lies above p-type epitaxial region 12g and acts as a cathode for the green photodiode. As may be seen from FIG. 1, the green photodiode cathode n-type region 14g lies below the surface of the semiconductor structure and can be referred to herein as a "buried detector layer" to differentiate it from a photodiode cathode that may be formed at the surface of the semiconductor structure. A multi-layer n-type contact plug is formed from n-type implants 18g and n-well 20g, and includes an n-type contact region 22g at the surface of n-well 20g for making electrical contact with the buried detector layer 14g via the contact. Such a structure is disclosed in co-pending application Ser. No. 09/884,863, filed Jun. 18, 2001, assigned to the same assignee as the present invention. This co-pending application is expressly incorporated by reference herein.

As may be seen most easily with reference to FIGS. 1 and 2 together, an annular p-well region 26g is disposed around and spaced apart from n-type region 20g. An annular polysilicon gate 28g is disposed over a thick gate dielectric 30g. An annular n-type region 32g is formed in the annular p-well region 26g. As persons of ordinary skill in the art will appreciate from an examination of FIG. 1, annular n-type region 32g and n-type region 22g may be formed using self-aligned gate techniques with annular polysilicon gate 28g as a mask. Shallow-trench isolation region 34g may be used for isolation of n-type region 32g. An annular transistor formed from n-type region 22g, annular n-type region 32g, and annular gate 28g over thick gate oxide 30g functions as a reset transistor for the green photodiode and has an annular channel region 36 disposed under gate 28g and between its source n-type region 22g and its drain n-type region 32g. The reference voltage Vref is applied to the drain 32g of the reset transistor and its source 22g is coupled to the cathode 14g of the green photodiode through the multi-layer contact 18g and n-well 20g.

A sense transistor, shown in the right-hand portion of p-well 26-2 of FIG. 1 has a gate 38g coupled to the n-type region 22g and thus to the cathode 14g of the green photodiode. The sense transistor 38g also employs a thick gate dielectric 30g. N+ region 40g forms the drain of the sense transistor and n+ region 42g forms its source as well as the drain of a row-select transistor (not shown). Persons of ordinary skill in the art will appreciate that the NMOS transistors other than the reset transistors associated with the active pixel sensor of FIGS. 1 and 2 may all be formed in p-well 26-1–26-3.

A blue photodiode is provided in a following manner. a second p-type epitaxial region 12b is deposited above the n-type cathode layer 14g. The p-type second p-type epitaxial region 12b acts as the anode of the blue photodiode. N-type region 14b lies above p-type epitaxial region 12b and acts as a cathode for the blue photodiode. A n-type contact plug is formed from n-well 20b, and includes an n-type contact region 22b at the surface of n-well 20b for making electrical contact with the detector layer 14b via the contact. Such a structure is disclosed in co-pending application Ser. No. 09/884,863, filed Jun. 18, 2001, assigned to the same assignee as the present invention. This co-pending application is expressly incorporated by reference herein.

As may be seen most easily with reference to FIGS. 1 and 2 together, an annular p-well region 26b is disposed around and spaced apart from n-type region 20b. An annular polysilicon gate 28b is disposed over a thick gate dielectric 30b. An annular n-type region 32b is formed in the annular p-well region 26b. As persons of ordinary skill in the art will appreciate from an examination of FIG. 1, annular n-type region 32b and n-type region 22b may be formed using self-aligned gate techniques with annular polysilicon gate 28b as a mask. Shallow-trench isolation region 34b may be used for isolation of n-type region 32b. An annular transistor formed from n-type region 22b, annular n-type region 32b, and annular gate 28b over thick gate oxide 30b functions as a reset transistor for the blue photodiode and has an annular channel region 36 disposed under gate 28b and between its source n-type region 22b and its drain n-type region 32b. The reference voltage Vref is applied to the drain 32b of the reset transistor and its source 22b is coupled to the cathode 14b of the green photodiode through the multi-layer contact 18b and n-well 20b.

A sense transistor, shown in the right-hand portion of p-well 26-2 of FIG. 1 has a gate 38b coupled to the n-type region 22b and thus to the cathode 14b of the green photodiode. The sense transistor 38b also employs a thick gate dielectric 30b. N+ region 40b forms the drain of the sense transistor and n+ region 42b forms its source as well as the drain of a row-select transistor (not shown). Persons of ordinary skill in the art will appreciate that the NMOS transistors other than the reset transistors associated with the active pixel sensor of FIGS. 1 and 2 may all be formed in p-well 26-1–26-3.

The electric field in the vertical three-color active pixel sensor 10 of the present invention is low for several reasons. As may be seen from FIG. 1, the junction between n-wells 20r, 20g, and 20b and the p-type regions is remote from the isolation edge. The isolation edge is known to be an area where higher stresses result in defects and gathering sites for impurities, both of which result in higher leakage current. In addition, as is well known in the art, the electric field associated with a semiconductor junction is a strong function of the impurity doping concentrations of the n-type and p-type semiconductor materials used to form the junction. In the reset transistor of FIG. 1, there are no n+/p-junctions, only more lightly doped n− to p-junctions. The n-wells 20r, 20g, and 20b only form a junction with the p-type regions and are spaced away from the more heavily doped p-wells 26r, 26g, and 26b. Finally, the use of thick gate dielectrics 30r, 30g, and 30b keep the field low at the junction of n-wells 20r, 20g, and 20b and the p-type regions 12r, 12g, and 12b under the gates 28r, 28g, and 28b.

Normal NMOS voltage thresholds are retained in this reset transistor by sufficient p-well overlap of the n+ outer ring of the transistor. Native NMOS threshold voltages (zero volts) could be obtained for this transistor by eliminating the p-well overlap, but longer channel lengths would be required to prevent punch through. If leakage from the Si—SiO$_2$ interface under the reset gate is significant, it can be suppressed by forcing the gate of the reset transistor into accumulation during photointegration.

The pixel sensor structure of FIG. 1 has the added advantage that it is silicide tolerant. Silicides and self-aligned silicides (salicides) are employed in deep sub-micron semiconductor manufacturing processes in order to improve the performance of the circuitry. Specifically, the use of silicided polysilicon greatly reduces the resistance of polysilicon interconnects, and therefore allows for faster operation of circuits. Additionally, salicides are employed to reduce the resistance of contacts between metal and silicon or polysilicon and silicon, as well as to reduce the resistance of diffusion regions such as the source or drain of a MOS transistor. By reducing the resistance, faster overall circuit speeds are achieved. A drawback to salicides, in particular for use in analog circuits and image sensors, is that the use of salicided junctions is known to increase leakage current, which is highly detrimental to the performance of an image sensor or any leakage sensitive analog circuit. The ability to design an image sensor that is tolerant of the use of salicided junctions is advantageous because the improved performance in terms of circuit operating speed can be achieved without sacrificing image sensor performance in the area of leakage current.

Because of the silicide-tolerant nature of the present invention, n+ regions 22, 32, 40, 42 may optionally be silicided according to the present invention. Of all of the silicided n+ regions 22, 32, 40, 42 only n+ region 22 represents a node in the circuit that is sensitive to leakage current, and because the pn junction is formed between the more lightly doped n−region 20 and the p-substrate 12, the salicided n+ region 22 will not cause an increase in leakage current, therefore permitting the global use of silicides in all of the circuitry and thus improving the performance of the speed of the circuits that is associated with the use of silicides and salicided junctions.

The three-color active pixel sensor of FIG. 1 can either be operated at high voltage with the same leakage as present CMOS active pixel sensors; or can be operated at the same voltage as present CMOS active pixel sensors with much lower leakage. These two operating modes could be used, for example, as exposure options for high light level and low light level operation.

Persons of ordinary skill in the art will appreciate that, while an exemplary embodiment of the present invention has been described as a part of a three-color active pixel sensor, the teachings of the present invention apply equally to monochrome pixel sensors.

Figure 3:
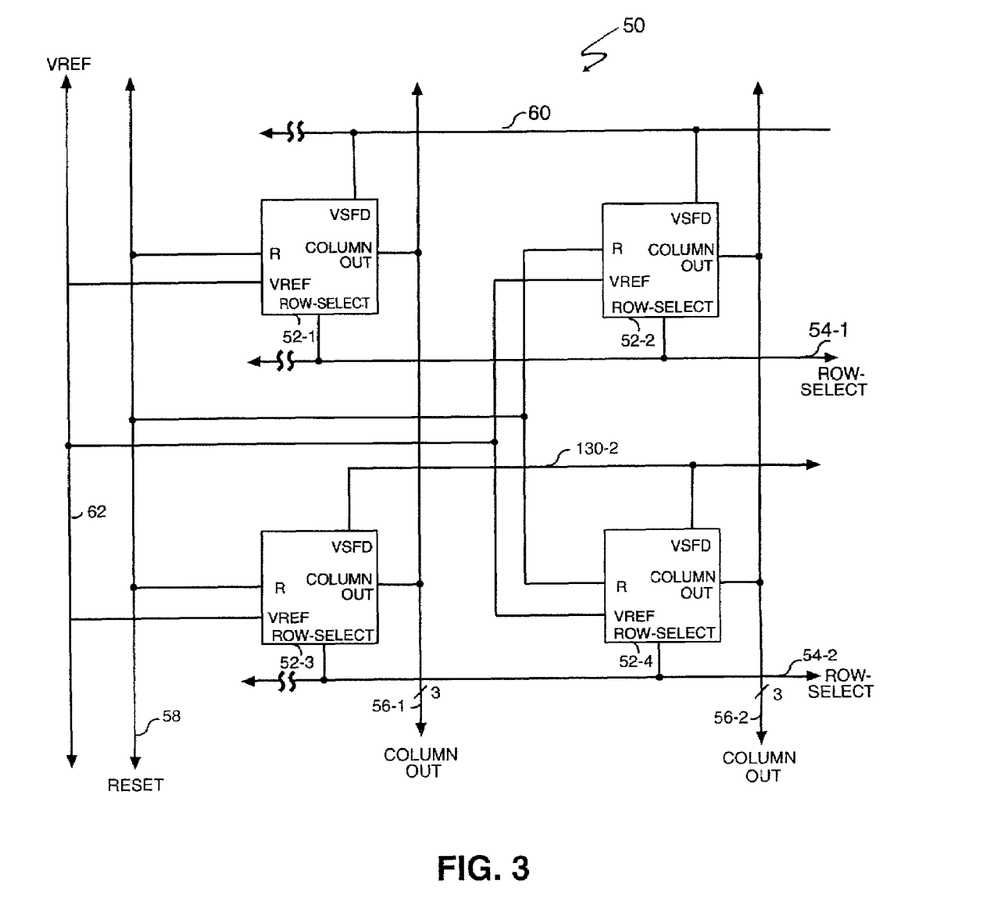
FIG. 3 is a block diagram of an illustrative array of three-color active pixel sensors in accordance with the present invention.

Referring now to FIG. 3, a block diagram shows an illustrative array of CMOS active pixel sensors of the type shown partially in FIGS. 1 and 2 according to the present invention. FIG. 3 shows an illustrative 2 by 2 portion 50 of an array of CMOS active pixel sensors according to the present invention. Persons of ordinary skill in the art will readily appreciate that the array portion 50 disclosed in FIG. 3 is illustrative only and that arrays of arbitrary size may be fabricated using the teachings herein.

The 2 by 2 portion 50 of the array in FIG. 3 includes two rows and two columns of CMOS active pixel sensors according to the present invention. A first row includes CMOS active pixel sensors 52-1 and 52-2; a second row includes CMOS active pixel sensors 52-3 and 52-4. A first column includes CMOS active pixel sensors 52-1, 52-3; a second column includes CMOS active pixel sensors 52-2 and 52-4.

A first ROW-SELECT line 54-1 is connected to the row-select inputs (ROW-SELECT) of CMOS active pixel sensors 52-1 and 52-2. A second ROW-SELECT line 54-2 is connected to the row-select inputs (ROW-SELECT) of CMOS active pixel sensors 52-3 and 52-4. The first and second ROW-SELECT lines may be driven from a row decoder (not shown) as is well known in the art.

A first COLUMN OUT line 56-1 is connected to the outputs of CMOS active pixel sensors 52-1 and 52-3. A second COLUMN OUT line 56-2 is connected to the outputs of CMOS active pixel sensors 52-2 and 52-4. The first and second COLUMN OUT lines are coupled to column readout circuits (not shown) as is well known in the art. Column lines 56-1 and 56-2 are shown in FIG. 3 as three-wire busses to provide one column output line for each of the colors red, blue, and green in a three-color CMOS active pixel sensor.

A RESET line 58 is connected to the reset (R) inputs of all of the CMOS active pixel sensors 52-1 through 52-4. A $V_{SFD}$ line is connected to the $V_{SFD}$ inputs (the drains of the source-follower amplifier transistors) of the active pixel sensors 52-1 through 52-4 in the array. Persons of ordinary skill in the art will appreciate that the VSFD lines may be biased at a fixed voltage or may be pulsed, and that individual $V_{SFD}$ lines (shown at reference numerals 60-1 and 60-2) may be employed for each row in the array.

A global $V_{REF}$ line 62 for the drains of the reset transistors is connected to the $V_{REF}$ inputs of all of the CMOS active pixel sensors 52-1 through 52-4. Alternately, multiple $V_{REF}$ lines (one for each column) could be provided.

Figure 4:
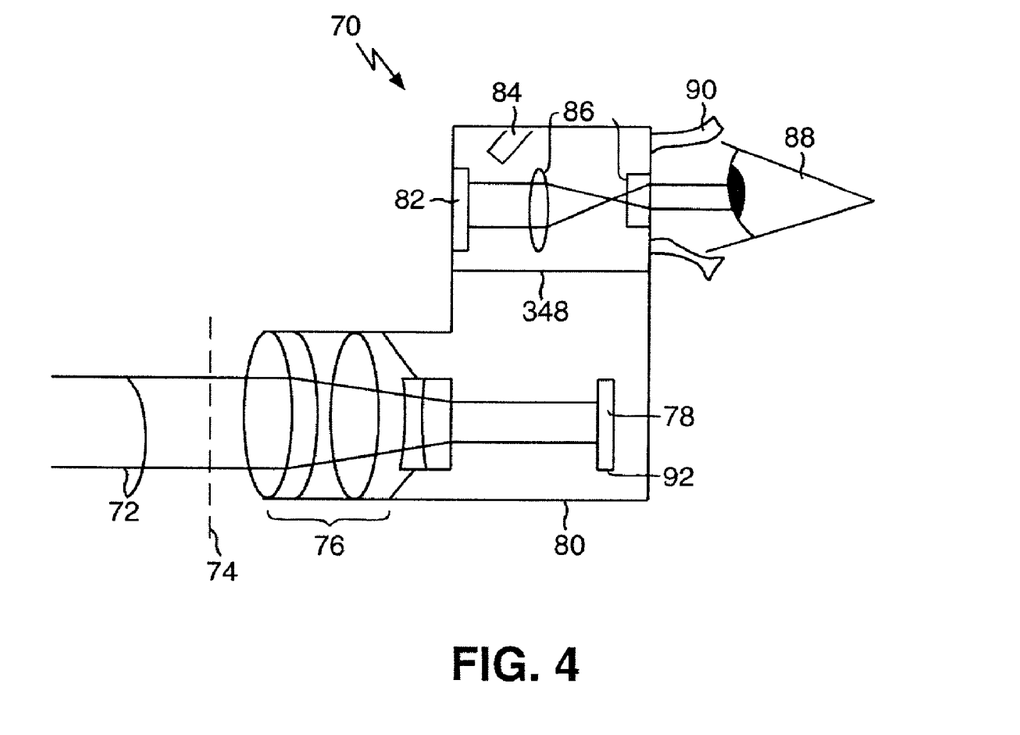
FIG. 4 is diagram of an electronic camera employing an array of active pixel sensors according to the present invention.

A digital still camera 70 employing an array of CMOS active pixel sensors according to the present invention is illustrated in FIG. 4. Rays of light 72 from a scene to the left of the figure are passed through mechanical shutter 74. Persons of ordinary skill in the art will appreciate that a "rolling shutter" type of electronic shutter may be employed in the present invention. The light rays are then focused by primary optical system 76 onto a sensor chip 78 containing an array of CMOS active pixel sensors according to the present invention. Optical system 76 and sensor chip 78 are housed within light-tight housing 80 to prevent stray light from falling on sensor chip 78 and thereby corrupting the image formed by rays 72. An electronic system, not illustrated in FIG. 4, takes electrical signals from sensor chip 78 and derives electrical signals suitable for driving display device 82, which can be a micro-display of either the micro-machined reflective type as supplied by Texas Instruments or of the liquid-crystal type, as supplied by vendors such as Kopin and Displaytech, or display device 82 can be an ordinary liquid crystal display (LCD) or organic LED-based display.

Display device 82 is illuminated by light-emitting-diode (LED) array 84. Reflected light from display chip 82 is focused by secondary optical system 86 in such a manner that images can be viewed by the eye 88 of the user of the camera. Alternatively, display device 82 can be a standard LCD or an organic light-emitting diode (OLED) array, in which cases the LED array 84 is replaced by either an LCD backlight or the OLED array. Both micro-display and OLED array technologies give bright displays with excellent color saturation and consume very little power, thus being suitable for integration into a compact camera housing as illustrated in FIG. 4. Ordinary LCD devices, while less power efficient, are also suitable. A light-tight baffle 86 separates the chamber housing sensor chip 78 from that housing LED array 84, display device 82, and secondary optical system 86. Viewing the image from display device 82 in bright sunlight is made easier by providing rubber or elastomer eye cup 90. Electrical cable and connections 92 allow for communication between sensor chip 78 and the outside world.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A low-leakage, high-dynamic range active pixel sensor comprising:
   a p-type semiconductor substrate;
   a photodiode cathode n-type region disposed within said semiconductor substrate forming a pn junction with said semiconductor substrate;
   an n-well disposed in said semiconductor substrate and in electrical contact with said photodiode cathode n-type region;
   an annular p-well in said semiconductor substrate disposed around and spaced apart from said n-well;
   an annular polysilicon gate region forming a gate for a reset transistor disposed over a thick gate dielectric on the surface of said semiconductor substrate;

an annular n-type region disposed within and inward from an inner periphery of said annular p-well and having inner edges substantially aligned with an outer periphery of said annular polysilicon gate region, said annular n-type region forming a drain for said reset transistor;

a surface n-type region disposed in said n-well at the surface of said semiconductor substrate, said surface n-type region having outer edges substantially aligned with an inner periphery of said annular polysilicon gate region, said surface n-type region forming a source for said reset transistor;

a sense transistor having a gate coupled to said surface n-type region, a drain coupled to a drain supply potential, and a source, said sense transistor having a thick gate dielectric;

an output transistor having a drain coupled to the source of said sense transistor, a gate coupled to a row-select line, and a source coupled to a column output line.

2. The low-leakage, high-dynamic range active pixel sensor of claim 1 wherein said photodiode cathode n-type region is a buried detector region and wherein said n-well is in electrical contact with said photodiode cathode n-type region through a multi-layer contact.

3. The low-leakage, high-dynamic range active pixel sensor of claim 1 wherein said sources, said drains, and said gates of said reset transistor, said sense transistor, said output transistor are silicided.

4. The low-leakage, high-dynamic range active pixel sensor of claim 1 wherein said pixel sensors is one of a plurality of active pixels sensors in a vertical three-color active pixel sensor.

5. An array of low-leakage, high-dynamic range CMOS active pixel sensors disposed on a p-type semiconductor substrate and arranged as a plurality of rows and columns comprising:

a reset signal line;

a plurality of row-select signal lines, a different one of said plurality of row-select signal lines associated with each row in the array;

a plurality of column output lines, a different one of said plurality of column output lines associated with each column in the array;

a plurality of low-leakage, high-dynamic range active pixel sensors, each said pixel sensor comprising;

a photodiode cathode n-type region disposed within said semiconductor substrate forming a pn junction with said semiconductor substrate;

an n-well disposed in said semiconductor substrate and in electrical contact with said photodiode cathode n-type region;

an annular p-well in said semiconductor substrate disposed around and spaced apart from said n-well;

an annular polysilicon gate region forming a gate for a reset transistor disposed over a thick gate dielectric on the surface of said semiconductor substrate, said annular polysilicon gate region coupled to said reset signal line;

an annular n-type region disposed within and inward from an inner periphery of said annular p-well and having inner edges substantially aligned with an outer periphery of said annular polysilicon gate region, said annular n-type region forming a drain for said reset transistor;

a surface n-type region disposed in said n-well at the surface of said semiconductor substrate, said surface n-type region having outer edges substantially aligned with an inner periphery of said annular polysilicon gate region, said surface n-type region forming a source for said reset transistor;

a sense transistor having a gate coupled to said surface n-type region, a drain coupled to a drain supply potential, and a source, said sense transistor having a thick gate dielectric;

an output transistor having a drain coupled to the source of said sense transistor, a gate coupled to a one of said row-select lines associated with a row in the array with which its pixel sensor is associated, and a source coupled to a one of said column output lines associated with a column in the array with which its pixel sensor is associated.

6. The array of claim 5 wherein, in each of said plurality of low-leakage, high-dynamic range active pixel sensors, said photodiode cathode n-type region is a buried detector region and wherein said n-well is in electrical contact with said photodiode cathode n-type region through a multi-layer contact.

7. The array of claim 5 wherein, in each of said plurality of low-leakage, high-dynamic range active pixel sensors, said sources, said drains, and said gates of said reset transistor, said sense transistor, said output transistor are silicided.

8. An electronic image-capture device comprising:

a light-tight enclosure;

an optical system positioned to focus light entering said light-tight enclosure onto a focal plane;

an array of low-leakage, high-dynamic range active pixel sensors disposed at said focal plane, said array of active pixel sensors disposed on a p-type semiconductor substrate and arranged as a plurality of rows and columns comprising:

a reset signal line;

a plurality of row-select signal lines, a different one of said plurality of row-select signal lines associated with each row in the array;

a plurality of column output lines, a different one of said plurality of column output lines associated with each column in the array;

a plurality of low-leakage, high-dynamic range active pixel sensors, each said pixel sensor comprising;

a photodiode cathode n-type region disposed within said semiconductor substrate forming a pn junction with said semiconductor substrate;

an n-well disposed in said semiconductor substrate and in electrical contact with said photodiode cathode n-type region;

an annular p-well in said semiconductor substrate disposed around and spaced apart from said n-well;

an annular polysilicon gate region forming a gate for a reset transistor disposed over a thick gate dielectric on the surface of said semiconductor substrate, said annular polysilicon gate region coupled to said reset signal line;

an annular n-type region disposed within and inward from an inner periphery of said annular p-well and having inner edges substantially aligned with an outer periphery of said annular polysilicon gate region, said annular n-type region forming a drain for said reset transistor;

a surface n-type region disposed in said n-well at the surface of said semiconductor substrate, said surface n-type region having outer edges substantially aligned with an inner periphery of said annular polysilicon gate region, said surface n-type region forming a source for said reset transistor;

a sense transistor having a gate coupled to said surface n-type region, a drain coupled to a drain supply potential, and a source, said sense transistor having a thick gate dielectric;

an output transistor having a drain coupled to the source of said sense transistor, a gate coupled to a one of said row-select lines associated with a row in the array with which its pixel sensor is associated, and a source coupled to a one of said column output lines associated with a column in the array with which its pixel sensor is associated.

9. The electronic image-capture device of claim 8 wherein, in each of said low-leakage, high-dynamic range active pixel sensors, said photodiode cathode n-type region is a buried detector region and wherein said n-well is in electrical contact with said photodiode cathode n-type region through a multi-layer contact.

10. The electronic image-capture device of claim 8 wherein, in each of said plurality of low-leakage, high-dynamic range active pixel sensors, said sources, said drains, and said gates of said reset transistor, said sense transistor, said output transistor are silicided.

11. The electronic image-capture device of claim 8 comprising a camera and further including:

a shutter coupled to said light-tight enclosure along a light path to said focal plane.

12. The camera of claim 11 wherein, in each of said low-leakage, high-dynamic range active pixel sensors, said photodiode cathode n-type region is a buried detector region and wherein said n-well is in electrical contact with said photodiode cathode n-type region through a multi-layer contact.

13. The camera of claim 11 wherein, in each of said plurality of low-leakage, high-dynamic range active pixel sensors, said sources, said drains, and said gates of said reset transistor, said sense transistor, said output transistor are silicided.

14. A vertical multi-color active pixel sensor having a plurality of low-leakage, high-dynamic range active pixel sensors, wherein each of said plurality of active pixel sensor detects a specific color and each of said plurality of active pixel sensors comprises:

a p-type semiconductor substrate;

a photodiode cathode n-type region disposed within said semiconductor substrate forming a pn junction with said semiconductor substrate;

an n-well disposed in said semiconductor substrate and in electrical contact with said photodiode cathode n-type region;

an annular p-well in said semiconductor substrate disposed around and spaced apart from said n-well;

an annular polysilicon gate region forming a gate for a reset transistor disposed over a thick gate dielectric on the surface of said semiconductor substrate;

an annular n-type region disposed within and inward from an inner periphery of said annular p-well and having inner edges substantially aligned with an outer periphery of said annular polysilicon gate region, said annular n-type region forming a drain for said reset transistor;

a surface n-type region disposed in said n-well at the surface of said semiconductor substrate, said surface n-type region having outer edges substantially aligned with an inner periphery of said annular polysilicon gate region, said surface n-type region forming a source for said reset transistor;

a sense transistor having a gate coupled to said surface n-type region, a drain coupled to a drain supply potential, and a source, said sense transistor having a thick gate dielectric;

an output transistor having a drain coupled to the source of said sense transistor, a gate coupled to a row-select line, and a source coupled to a column output line.

15. The vertical multi-color pixel sensor of claim 14 wherein said photodiode cathode n-type region in each of said plurality of low-leakage, high-dynamic range active pixel sensors is a buried detector region and wherein said n-well in each of said plurality of low-leakage, high-dynamic range active pixel sensors is in electrical contact with said photodiode cathode n-type region through a multi-layer contact.

16. The vertical multi-color active pixel sensor of claim 14 wherein said sources, said drains, and said gates of said reset transistor, said sense transistor, said output transistor in each of said plurality of low-leakage, high-dynamic range active pixel sensors are silicided.

17. A low-leakage, high-dynamic range vertical multi-color active pixel sensor comprising:

a substrate of p-type material;

a first region of n-type material disposed within said substrate forming a pn junction therewith and acting as a cathode for a first of a plurality of photodiodes;

a first layer of p-type material disposed above said first region of n-type material;

a second region of n-type material disposed within said first layer of p-type material forming a pn junction therewith and acting as a cathode of a second of said plurality of photodiodes;

a second layer of p-type material disposed above said second region of n-type material and said first layer of p-type material;

a third region of n-type material disposed within said second layer of p-type material forming a pn junction therewith and acting as a cathode for a third of said plurality of photodiodes; and each of said plurality of photodiodes associated with a structure including:

a n-type contact disposed in said second layer of p-type material and in electrical contact with its respective cathode;

an annular p-well in said second layer of said p-type material disposed around and spaced apart from said n-type contact;

an annular polysilicon gate region forming a gate for a reset transistor disposed over a thick gate dielectric on the surface of said second layer p-type material;

an annular n-type region disposed within and inward from an inner periphery of said annular p-well and having inner edges substantially aligned with an outer periphery of said annular polysilicon gate region, said annular n-type region forming a drain for said reset transistor;

a surface n-type region disposed in said n-type contact at the surface of said second layer of p-type material, said surface n-type region having outer edges substantially aligned with an inner periphery of said annular polysilicon gate region, said surface n-type region forming a source for said reset transistor;

a sense transistor having a gate coupled to said surface n-type region, a drain coupled to a drain supply potential, and a source, said sense transistor having a thick gate dielectric; and an output transistor having a drain coupled to the source of said sense transistor, a gate coupled to a row-select line, and a source coupled to a column output line.

18. The vertical multi-color pixel sensor of claim 17 wherein said first and second regions of n-type material are buried detector regions and wherein said n-type contacts for said first and said second ones of said plurality are in electrical contact with said cathodes of said first and second plurality of photodiodes through a multi-layer contact.

19. The vertical multi-color active pixel sensor of claim 18 wherein said sources, said drains, and said gates of said reset transistors, said sense transistors, and said output transistors of said structure associated with each of said plurality of photodiodes are silicided.

* * * * *